United States Patent
Haynes et al.

(10) Patent No.: US 12,429,529 B2
(45) Date of Patent: Sep. 30, 2025

(54) SYSTEMS AND METHODS FOR LOW LATENCY AND HIGH RELIABILITY WIRELESS DIRECT TRANSFER TRIP ("DTT")

(71) Applicant: Verizon Patent and Licensing Inc., Basking Ridge, NJ (US)

(72) Inventors: Thomas W. Haynes, Clayton, CA (US); Samita Chakrabarti, Bedminster, NJ (US); Jin Yang, Orinda, CA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 162 days.

(21) Appl. No.: 18/514,464

(22) Filed: Nov. 20, 2023

(65) Prior Publication Data

US 2025/0164576 A1    May 22, 2025

(51) Int. Cl.
*G01R 31/52*    (2020.01)
*G01R 31/08*    (2020.01)

(52) U.S. Cl.
CPC ........... *G01R 31/52* (2020.01); *G01R 31/088* (2013.01)

(58) Field of Classification Search
None
See application file for complete search history.

(56) References Cited

U.S. PATENT DOCUMENTS

2015/0177277 A1\* 6/2015 Nickel ............... G01R 31/2822
324/629

\* cited by examiner

*Primary Examiner* — Farhana A Hoque

(57) ABSTRACT

A system described herein may maintain information indicating groups of wireless trip devices. The system may maintain information associating each wireless trip device, of a plurality of wireless trip devices, with respective edge computing devices. The system may receive a wireless alert from a particular wireless trip device, which indicates an electrical fault condition. The system may identify a particular group of wireless trip devices with which the wireless alert is associated, and may identify a particular set of edge computing devices that are associated with respective wireless trip devices of the group of wireless trip devices. The system may output, to each edge computing device of the identified particular set of edge computing devices, a notification based on the wireless alert, and each edge computing device may wirelessly communicate respective wireless trip devices based on the wireless alert received from the particular wireless trip device.

20 Claims, 9 Drawing Sheets

| Device ID | Location | Device attributes |
|---|---|---|
| 103-1 | {Loc_A} | {Attribs_A} |
| 103-2 | {Loc_B} | {Attribs_B} |
| 103-3 | {Loc_C} | {Attribs_C} |

| Device ID | Alert group |
|---|---|
| 103-1 | {Group_A} |
| 103-2 | {Group_A} |
| 103-3 | {Group_B} |

SYSTEMS AND METHODS FOR LOW LATENCY AND HIGH RELIABILITY WIRELESS DIRECT TRANSFER TRIP ("DTT")

BACKGROUND

Electrical infrastructure systems may utilize various different types of transmission and/or distribution equipment. Electrical faults may occur in the transmission or distribution of electrical power, and remedying or mitigating such faults may require rapidly (e.g., within the order of milliseconds) actuating devices at geographically diverse locations, such as remotely tripping circuit breakers at different electrical substations. Direct Transfer Trip ("DTT") is a methodology that utilizes wired networks in order to quickly deliver signals, such as fault signals and/or trip instructions, in order to quickly trip remote circuit breakers in response to detected electrical faults. In a DTT scheme, a wired network includes a hub or switch that propagates (e.g., broadcasts) fault signals and/or trip instructions to all devices that are connected to the hub or switch via a wired interface (e.g., Ethernet cabling, fiber optic cabling, or other suitable types of wired interfaces).

BRIEF DESCRIPTION OF THE DRAWINGS

FIGS. 2-4 illustrate example data structures that may be used in one or more embodiments described herein;

DETAILED DESCRIPTION OF EXAMPLE EMBODIMENTS

The following detailed description refers to the accompanying drawings. The same reference numbers in different drawings may identify the same or similar elements.

DTT is a methodology that utilizes wired networks in order to quickly deliver signals, such as fault signals and/or trip instructions, in order to quickly trip remote circuit breakers in response to detected electrical faults. Wired DTT implementations include a hub or switch that broadcasts and/or otherwise propagates fault signals, alerts, trip instructions, etc. to all connected devices, thus facilitating a rapid response (e.g., tripping remote circuit breakers) to a detected fault.

Wireless networks provide wireless connectivity to User Equipment ("UEs"), which may include Internet of Things ("IoT") devices, Machine-to-Machine ("M2M") devices, mobile telephones, tablets, or the like. The use of wireless networks to implement DTT would improve the flexibility and lower the cost and/or other resources consumed in establishing wired communications between a DTT hub or switch and associated DTT devices (e.g., remote DTT devices that trip circuit breakers or otherwise respond to electrical faults in geographically diverse locations). However, traditional wireless networks cannot effectively implement DTT for several reasons, such as a lack of sufficient broadcasting capabilities and high transmission latency. Embodiments described herein provide for techniques to utilize a wireless network for DTT-type messaging (e.g., reporting fault conditions, causing remote DTT devices to implement remedial measures such as tripping remote circuit breakers, etc.), providing flexibility and reduced resources needed for implementing DTT. The embodiments described herein provide multi-device notifications using very low latency communications, such that the wireless DTT techniques described herein may be on par with, or faster than, wired DTT implementations.

Figure 1:
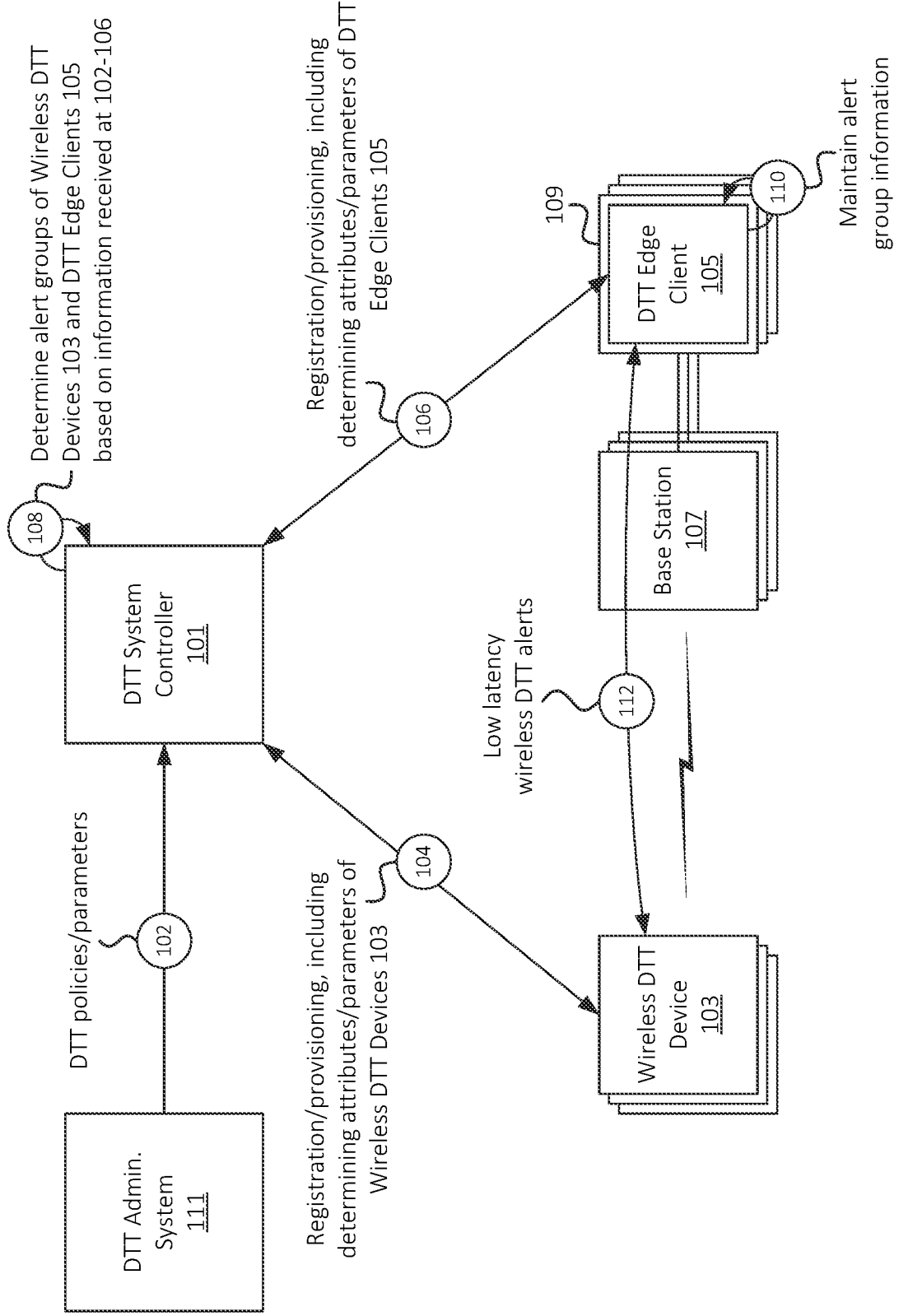
FIG. 1 illustrates an example overview of one or more embodiments described herein.

As shown in FIG. 1, for example, DTT System Controller ("DSC") 101 may communicate with Wireless DTT Devices ("WDDs") 103 and DTT Edge Clients ("DECs") 105, which may be located in geographically distinct regions (e.g., different neighborhoods, cities, states, etc.), in order to wirelessly provide DTT or DTT-type services to such geographically distinct regions in a low latency manner. WDDs 103 may be, may include, and/or may be communicatively coupled to electrical circuit breakers or other types of devices that detect and/or respond to electrical faults. As discussed above, responding to an electrical fault (e.g., a DTT alert or other suitable type of signal from another DTT device such as another WDD 103) may include actuating, tripping, etc. one or more circuit breakers, opening (e.g., shutting off) an electrical switch, powering down one or more electrical circuits, and/or other suitable actions. WDDs 103 may include wireless circuitry via which WDDs 103 may wirelessly communicate with one or more wireless networks. Such wireless networks may include a Fifth Generation ("5G") network or other suitable network delivering low latency services. The wireless networks may include a set of base stations 107, which may include antennas, radios, or other suitable wireless network infrastructure equipment to provide wireless connectivity to WDDs 103 and/or other types of wireless devices.

Base stations 107 may include, may implement, may be communicatively coupled to, and/or may otherwise be associated with one or more edge computing devices 109. For example, a first base station 107 may be associated with a first edge computing device 109, a second base station 107 may be associated with a second edge computing device 109, and so on. In some embodiments, a given edge computing device 109 may include, may be implemented by, and/or may otherwise be associated with a Multi-Access/Mobile Edge Computing ("MEC") device, referred to sometimes herein simply as a "MEC." Base stations 107 may forward some traffic received via connected wireless devices, such as WDDs 103 or other devices, to an associated edge computing device 109, in lieu of forwarding such traffic to a core network. Each edge computing device 109 may implement a particular DEC 105, which may aid in providing DTT services discussed herein. For example, one or more containers, applications, libraries, etc. associated with DEC 105 may be installed on, instantiated at, executed by, etc. each edge computing device 109, such that multiple edge computing devices 109 each implement a respective instance of DEC 105. In some embodiments, each edge computing device 109 may also implement one or more gateways, endpoints, or other suitable routing mechanisms (e.g., a User Plane Function ("UPF"), a Packet Data Network ("PDN") gateway ("PGW"), etc.) via which traffic is routed to respective DECs 105 instead of to the core network.

As shown, DSC 101 may receive (at 102) DTT policies and/or parameters from DTT Administrator System ("DAS") 111. DAS 111 may be associated with an administrator, an operator, etc. that provides, manages, and/or is otherwise associated with a respective set of WDDs 103. The policies and/or parameters may include, for example, identifiers of WDDs 103 (e.g., device identifiers, Internet Protocol ("IP") addresses, Subscription Permanent Identifiers ("SUPIs"), Globally Unique Temporary Identifiers ("GUTIs"), and/or other suitable identifiers), policies indicating criteria based on which alert groups may be identified (e.g., groups of WDDs 103 to be notified of a given detected fault condition), and/or other suitable parameters and/or policies.

DSC 101 may also receive (at 104) information registering, provisioning, etc. a set of WDDs 103. For example, DSC 101 may receive such information from DAS 111, from WDDs 103, and/or from some other suitable device or system (e.g., via a provisioning or onboarding procedure). DSC 101 may receive, for example, location information of WDDs 103. The location information may include latitude and longitude coordinates, wireless network tracking area ("TA") information, connected base station information (e.g., Cell Global Identity ("CGI") of a respective base station 107 to which WDD 103 is wirelessly connected), and/or other suitable location information. In some embodiments, WDD 103 may execute an application, implement an application programming interface ("API"), etc. via which DSC 101 may provide the location information of WDD 103 to DSC 101. Additionally, or alternatively, DSC 101 may receive location information of WDD 103 from DAS 111 and/or some other suitable device or system. In some embodiments, DSC 101 may also receive (at 104) other attributes of WDDs 103, such as device type, device capabilities (e.g., breaker voltage, breaker amperage, etc.), and/or other attributes.

DSC 101 may also receive (at 106) information registering, provisioning, etc. a set of DECs 105. As discussed above, DECs 105 may be installed at, instantiated at, etc. respective edge computing devices 109. For example, DAS 111 and/or some other suitable device, system, or entity may install DECs 105 at edge computing devices 109. DSC 101 may receive, from DAS 111, from DECs 105 themselves, and/or from some other suitable device or system attributes and/or parameters of DECs 105. Such attributes and/or parameters may include location information, which may include latitude and longitude coordinates, a CGI or other identifier of a respective base station 107 with which each respective DEC 105 is associated, an IP address or other identifier of a respective edge computing device 109 at which each DEC 105 is installed, one or more TAs served by a base station 107 with which edge computing device 109 is associated, etc.

DSC 101 may also determine (at 108) alert groups of WDDs 103 and DECs 105 based on some or all of the above-discussed information. For example, DSC 101 may evaluate the DTT policies and/or parameters (received at 102), which may include conditions related to device types and/or locations. As one example, the DTT parameters and/or polices may indicate that all devices located within a particular geographical region (e.g., which may be served by multiple base stations 107 and/or edge computing devices 109) are associated with the same alert group. As another example, the DTT parameters and/or policies may indicate that all devices associated with a particular category, label, tag, etc. are associated with the same alert group. As yet another example, the DTT parameters and/or policies may include temporal conditions, weather conditions, or other conditions based on which DSC 101 may dynamically identify alert groups. For example, in the event of a large storm, DSC 101 may identify that a larger set of WDDs 103 are included in a given alert group than in clear weather conditions (e.g., more WDDs 103 may be alerted for certain faults given certain weather conditions, temporal conditions, and/or other conditions).

DSC 101 may, as part of or pursuant to the registration (at 106) of DECs 105, provide alert group information to DECs 105. DECs 105 may each maintain (at 110) the alert group information. In situations where DSC 101 dynamically determines or updates alert group information (e.g., based on changing conditions), DSC 101 may update DECs 105 in real time or near-real time, such that DECs 105 maintain up-to-date alert group information. In this manner, DECs 105 may be "aware" of each other, and may further be "aware" of which particular WDDs 103 are associated with (e.g., communicatively coupled to) which respective DECs 105. DECs 105 may use such information when sending or receiving (at 112) wireless DTT alerts. For example, as discussed below, a given DEC 105 may receive a DTT alert (e.g., an indication of an electrical vault) as wirelessly provided (e.g., via an associated base station 107) by a given WDD 103, may identify one or more other WDDs 103 and any associated DECs 105 that are included in an alert group that is associated with the DTT alert, and may propagate the DTT alert to WDDs 103 of the alert group via any associated DECs 105.

Since the wireless communications provided between WDDs 103 and respective base stations 107 may be relatively low latency communications, and further because DECs 105 are implemented by dedicated hardware that is communicatively coupled to base stations 107 (e.g., edge computing devices 109), the processing and forwarding of DTT alerts may be performed rapidly, such as within one or more thresholds, specifications, requirements, etc. of DTT alerting protocols. The wireless alerts provided herein may be provided via unicast messages (e.g., messages directed to particular WDDs 103 and/or DECs 105) to geographically diverse devices, thus providing similar alert delivery as would be provided by a wired broadcast alert system.

FIG. 2 illustrates example data structure 201, which may represent information indicating parameters, attributes, etc. of respective WDDs 103. DSC 101 may receive, generate, maintain, etc. data structure 201 based on registration and/or provisioning procedures associated with multiple different WDDs 103, such as example WDDs 103-1, 103-2, and 103-3. As shown, WDD 103-1 may be associated with a first location ("{Loc_A}"). As discussed above, the location information for a given WDD 103 may include latitude and longitude coordinates, a TA of a wireless network in which WDD 103 is located, an identifier of a particular base station 107 to which WDD 103 is connected, an identifier of a particular edge computing device 109 with which WDD 103 is in communication, an indication of an electrical substation or other type of facility in which WDD 103 is located, and/or other suitable location information. WDD 103-1 may also be associated with a particular set of attributes ("{Attribs_A}"). As discussed above, such attributes may include technical specifications, thresholds, make and/or model, and/or other suitable attributes.

Data structure 301, shown in FIG. 3, reflects alert groups that include different WDDs 103. As discussed above, DSC 101 may dynamically determine alert groups based on attributes of respective WDDs 103, locations of respective WDDs 103, policies and/or parameters (e.g., as received (at 102) from DAS 111 and/or some other source), and/or other suitable information. Additionally, or alternatively, DSC 101 may receive (e.g., from DAS 111) information specifying which particular WDDs 103 are included in which particular alert groups. In this example, a first alert group ("{Group_A}") includes WDDs 103-1 and 103-2, while a second alert group ("{Group_B}") includes one or more other WDDs 103, such as WDD 103-3.

Figure 4:
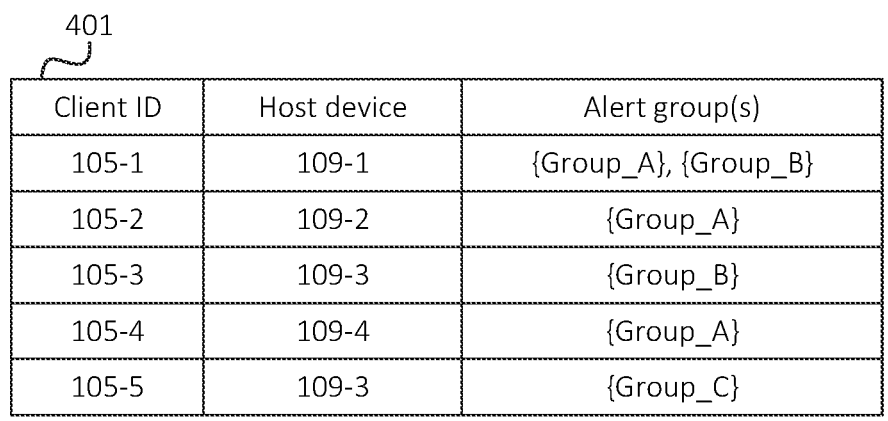
Figure 4:

As shown in FIG. 4, data structure 401, which may be maintained by DSC 101, reflects which particular DECs 105 are associated with which particular alert groups. Data structure 401 may include an identifier of each DEC 105 (e.g., example DECs 105-1 through 105-5), such as an IP address or other suitable identifier. Data structure 401 may also include an identifier of a particular edge computing device 109 on which each DEC 105 is hosted. For example, hardware resources of a given edge computing device 109 may be allocated for a given DEC 105, and/or DECs 105 may otherwise be installed on respective edge computing devices 109. As shown, a given DEC 105 may be associated with a single alert group or multiple alert groups. For example, DEC 105-1, hosted at edge computing device 109-1, may be associated with two alert groups (i.e., "{Group_A}" and "{Group_B}" in this example). For example, WDDs 103 belonging to multiple alert groups may be located within a service region of edge computing device 109-1, may be connected to a particular base station 107 with which edge computing device 109-1 is associated or co-located, and/or may otherwise be assigned to be served by edge computing device 109-1.

As further shown, multiple instances of DEC 105 may be installed on the same edge computing device 109. For example, DECs 105-3 and 105-5 may be installed on edge computing device 109-3. In one example scenario, DEC 105-3 may be associated with WDDs 103 that are owned by, operated by, and/or otherwise associated with a first entity (e.g., a first power company, a first organization, a first provider, etc.) while DEC 105-5 may be associated with WDDs 103 that are owned by, operated by, and/or otherwise associated with a second entity.

As further shown in this example, DECs 105-1, 105-2, and 105-4 are associated with the same alert group (e.g., "{Group_A}"). In accordance with embodiments described herein, a DTT alert for {Group_A} would be provided to DECs 105-1, 105-2, and 105-4 for forwarding and delivery to respective WDDs 103 that are communicatively coupled to such DECs 105-1, 105-2, and 105-4. In some embodiments, each DEC 105 may receive some or all of the information shown in data structure 401. In some embodiments, each DEC 105 may receive only portions applicable to each respective DEC 105 (e.g., DECs 105 of the same alert groups may receive information indicating other DECs 105 that are associated with the same alert groups, while not receiving information indicating DECs 105 of other alert groups). In some embodiments, DECs 105 may also receive information indicating particular WDDs 103 that are associated with respective alert groups (e.g., as discussed above with respect to data structure 301).

Figure 5:
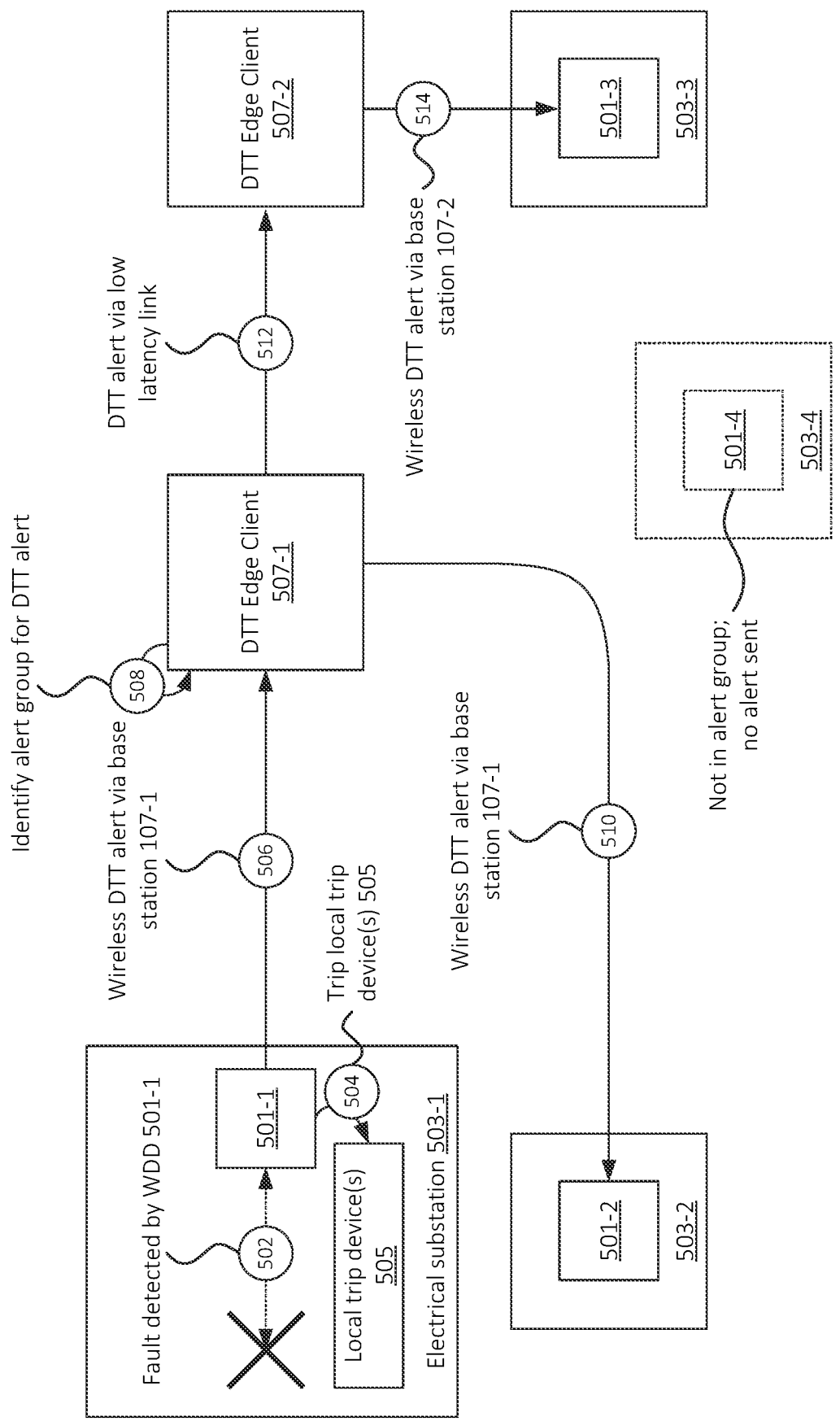
FIG. 5 illustrates an example of implementing a wireless trip alert scheme, in accordance with some embodiments.

FIG. 5 illustrates an example wireless DTT alert scenario in accordance with some embodiments. WDDs 501 and DECs 507, referred to in the example of FIG. 5, may refer to WDDs 103 and DECs 105 discussed above, respectively. As shown, a first WDD 501-1, located at a first facility such as electrical substation 503-1, may detect (at 502) an electrical fault or other type of condition for which a DTT alert should be sent. For example, WDD 501-1 may detect an overvoltage fault, an overcurrent fault, an undervoltage fault, and/or some other suitable type of condition. In some embodiments, WDD 501-1 may trip, actuate, etc. (at 504) a set of local trip devices 505, such as circuit breakers that are located in electrical substation 503-1 and/or to which WDD 501-1 is communicatively coupled to (e.g., via wires, cables, etc.). WDD 501-1 may also output (at 506) a wireless DTT alert, via base station 107-1 to which WDD 501-1 is wirelessly connected, to DEC 507-1. As discussed above, WDD 501-1 may execute an application, implement an API, and/or otherwise establish communications with DEC 507-1. For example, such application, API, etc. may be configured to communicate with DEC 507-1, may be configured to participate in a discovery or registration process in which DEC 507-1 is selected (e.g., out of a pool of candidate DECs 507) to serve WDD 501-1, may be configured to add one or more tags or labels based on which traffic from WDD 501-1 is routed to DEC 507-1, etc. In some embodiments, the connection between WDD 501-1 and DEC 507-1 may be via a UPF that transports communications traffic. In some embodiments, wireless traffic between WDD 501-1 and DEC 507-1 (e.g., sent via a particular base station 107-1 with which DEC 507-1 is associated) may be associated with a relatively high priority or Quality of Service ("QoS") level. In this manner, performance (e.g., latency) and reliability of communications between WDDs 501 and DECs 507 (e.g., via respective base stations 107) may meet or exceed thresholds and/or policies for DTT alerts (e.g., providing for extremely rapid alerting of fault conditions and remediating such conditions).

DEC 507-1 may identify (at 508) an alert group for the received alert. For example, DEC 507-1 may determine that WDD 501-1 is part of a particular alert group (e.g., based on information represented in data structure 301), and/or that the alert should otherwise be provided to WDDs 501 of the particular alert group (e.g., based on type of fault detected, location of the detected fault, temporal conditions, and/or other conditions). In this example, assume that the alert group includes WDDs 501-2 and 501-3, and does not include WDD 501-4. In this example, WDD 501-2 may be located at a different electrical substation 503-2, but may be wirelessly connected to the same base station 107 as WDD 501-1 (i.e., base station 107-1 in this example). In some implementations, WDD 501-1 may use the same UPF as WDD 501-1. DEC 507-1 may identify (e.g., based on information represented in data structure 401) that DEC 507-1 is assigned to serve WDD 501-2, and may accordingly output (at 510) a wireless DTT alert (e.g., via base station 107-1) to WDD 501-2. WDD 501-2 may proceed to perform one or more remedial operations based on receiving the wireless DTT alert, such as actuating one or more circuit breakers or other types of devices at electrical substation 503-2.

As additionally shown, DEC 507-1 may output (at 512) a DTT alert, based on the DTT alert received (at 502) from WDD 501-1, to DEC 507-2. For example, DEC 507-1 may determine (e.g., based on information represented in data structure 401) that DEC 507-1 is assigned to serve WDD 501-3, and may accordingly forward the DTT alert to DEC 507-2 for delivery to WDD 501-3. DEC 507-1 may indicate, for example, that the DTT alert is associated with (e.g., directed to, intended for, etc.) the particular alert group, and/or that the DTT alert is associated with WDD 501-3 in particular. The communication link between DECs 507-1 and DEC 507-2 may include a low latency communication link, such as a dedicated fiber line, an IP session with a relatively high QoS level, etc. In this manner, DECs 507-1 and 507-2 may be able to communicate with extremely low latency, thus satisfying parameters or thresholds of DTT communications.

In some embodiments, in addition to or in lieu of outputting DTT alerts to DEC 507-2 with which respective WDD 501-3 is associated, DEC 507-1 may output the alert to DSC 101. DEC 507-1 may, for example, indicate a particular alert group for the alert, to DSC 101, which may identify respective WDDs 501 included in the alert group (e.g., WDDs 501-2 and/or 501-3 in this example) and/or respective DECs 507 with which such WDDs 501 are associated (e.g., DECs 507-1 and/or 507-2 in this example). Additionally, or alternatively, DEC 507-1 may indicate WDD 501-3 and/or DEC 507-2 as a destination for the alert, based on which DSC 101 may forward the alert to WDD 501-3 (e.g., via DEC 507-2). In other words, in some embodiments, DSC 101 may act as a message relay between different DECs 507.

In the event that DEC 507-1 indicates that the DTT alert is associated with the particular alert group, DEC 507-2 may identify that WDD 501-3 (e.g., located at electrical substation 503-3) is associated with the indicated alert group. Based on receiving (at 512) the DTT alert and further based on identifying that the DTT alert should be forwarded to WDD 501-3, DEC 507-2 may output (at 514) a wireless DTT alert to WDD 501-3 via an associated base station 107-2. As discussed above, DEC 507-2 may be co-located with, may be implemented by the same hardware resources as, may be communicatively coupled to, and/or may otherwise be associated with base station 107-2 and/or a particular edge computing device 109 that is associated with base station 107-2. In some implementations, the connection between DEC 507-2 and WDD 501-3 may be through a UPF that carries communications traffic and is a different UPF than a UPF that serves WDD 501-1 and DEC 507-1. WDD 501-3 may proceed to perform one or more remedial operations based on receiving the wireless DTT alert, such as actuating one or more circuit breakers or other types of devices at electrical substation 503-3.

As noted above, WDD 501-4 is not in the alert group identified in the example discussed above. As such, DECs 507 (e.g., DECs 507-1 and/or 507-2) may refrain from outputting a DTT alert to WDD 501-4, which may be located at electrical substation 503-4. For example, DEC 507-1 may refrain from sending a DTT alert to a respective DEC 507 with which WDD 501-4 is associated, and/or may otherwise refrain from outputting a DTT alert that is directed to WDD 501-4. In this manner, network resources may be utilized efficiently, without sending messages that are not applicable to respective WDDs 501.

Figure 6:
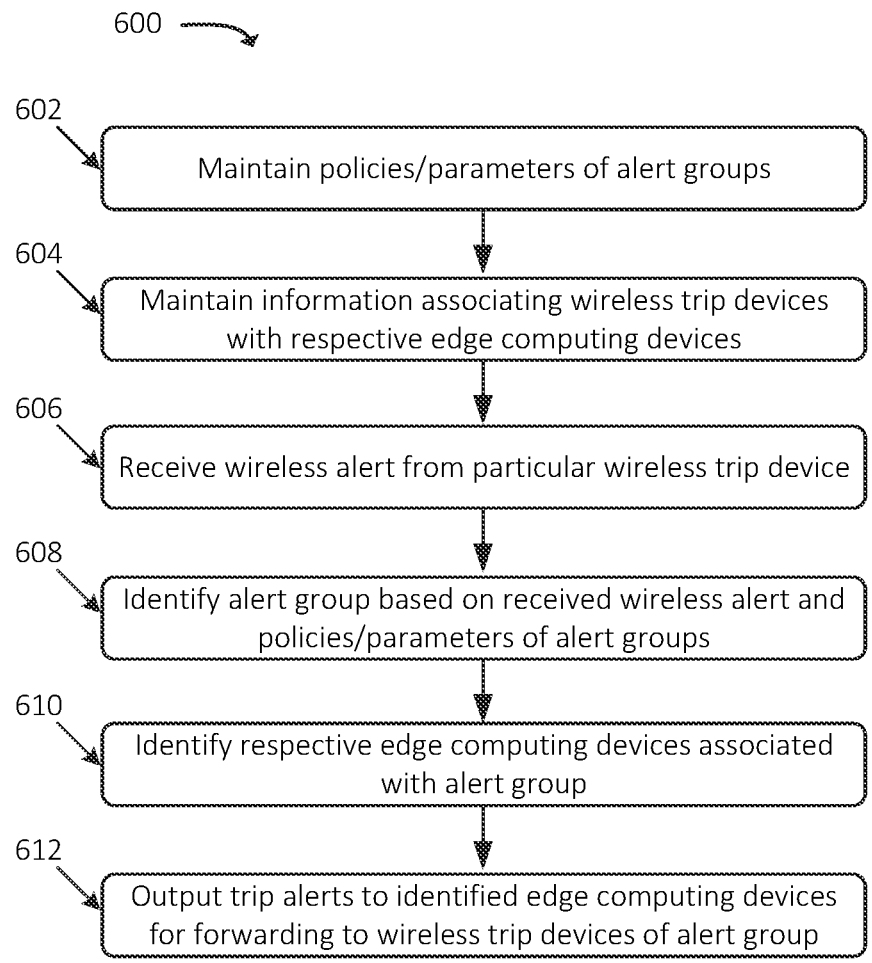
FIG. 6 illustrates an example process for implementing a wireless trip alert scheme, in accordance with some embodiments.

FIG. 6 illustrates an example process 600 for implementing a wireless trip alert scheme of some embodiments. In some embodiments, some or all of process 600 may be performed by a particular DEC 105.

As shown, process 600 may include maintaining (at 602) sets of policies and/or parameters of alert groups. As discussed above, such policies and/or parameters may include conditions based on which particular groups of WDDs 103 should be alerted. For example, when one WDD 103 of a given group detects an electrical fault, all WDDs 103 of the group should be alerted. In some embodiments, different triggering events may be indicated in the policies and/or parameters as triggers for when a given group of WDDs 103 should be alerted. In some embodiments, the policies and/or parameters may explicitly indicate particular alert groups (e.g., may include identifiers or other suitable information of WDDs 103 that are included in a particular alert group).

Process 600 may further include maintaining (at 604) information associating wireless trip devices (e.g., WDDs 103) with respective edge computing devices 109. For example, as discussed above, DSC 101 may receive and/or maintain location information, connected base station information, and/or other suitable information regarding particular WDDs 103, based on which DSC 101 may identify a particular edge computing device 109 that is associated with each respective WDD 103. As discussed above, such edge computing devices 109 may each be associated with respective DECs 105. For example, a particular DEC 105 may be installed on, provisioned on, etc. a particular edge computing device 109. As also discussed above, edge computing devices 109 may be implemented by the same hardware as associated base stations 107, and/or may otherwise be communicatively coupled to respective base stations 107, such that communications between DECs 105 and WDDs 103 may be provided with minimal latency.

Process 600 may additionally include receiving (at 606) a wireless alert from a particular wireless trip device. For example, DEC 105 may receive, via an associated base station 107, a wireless alert from a particular WDD 103 that is wirelessly connected to base station 107. The alert may indicate that such WDD 103 detected an electrical fault condition, such as an overvoltage fault, an overcurrent fault, etc. As discussed above, WDD 103 may be configured to provide the alert to DEC 105 based on a previous registration procedure or other suitable type of configuration based on which WDD 103 communicates alerts to DEC 105 (e.g., as opposed to other instances of DEC 105, which may be installed at other edge computing devices 109).

Process 600 may also include identifying (at 608) an alert group based on the received wireless alert, and further based on the received policies and/or parameters. For example, as discussed above, DEC 105 may determine that the wireless alert indicates a particular type of electrical fault, was received from a particular electrical substation, was received from a particular WDD 103, and/or may evaluate or identify one or more other conditions. DEC 105 may further identify one or more other WDDs 103 to notify based on the received alert (e.g., other WDDs 103 of the alert group).

Process 600 may further include identifying (at 610) respective edge computing devices 109 associated with the alert group. For example, as discussed above, DEC 105 may identify edge computing devices 109 on which one or more other DECs 105 are installed or instantiated, where such other DECs 105 are associated with (e.g., assigned to serve) other WDDs 103 of the alert group.

Process 600 may additionally include outputting (at 612) trip alerts to the identified edge computing devices 109, for forwarding to respective wireless trip devices of the alert group. For example, DEC 105 may communicate with one or more other DECs 105 (e.g., as installed at the identified edge computing devices 109, which may be at remote or geographically diverse locations) via one or more high speed and/or low latency links, such as a dedicated line, a communication session with relatively high QoS parameters or low latency Service Level Agreements ("SLAs"), etc. The one or more other DECs 105 may wirelessly forward the alerts to associated WDDs 103. As discussed above, the wireless propagation of such alerts allows for simplified deployment of such systems, without requiring wired infrastructure to be established for such schemes. Further, the use of rules and/or policies to determine alert groups provides for a more dynamic and configurable reporting of electrical fault conditions, therefore enhancing the flexibility of such systems.

Figure 7:
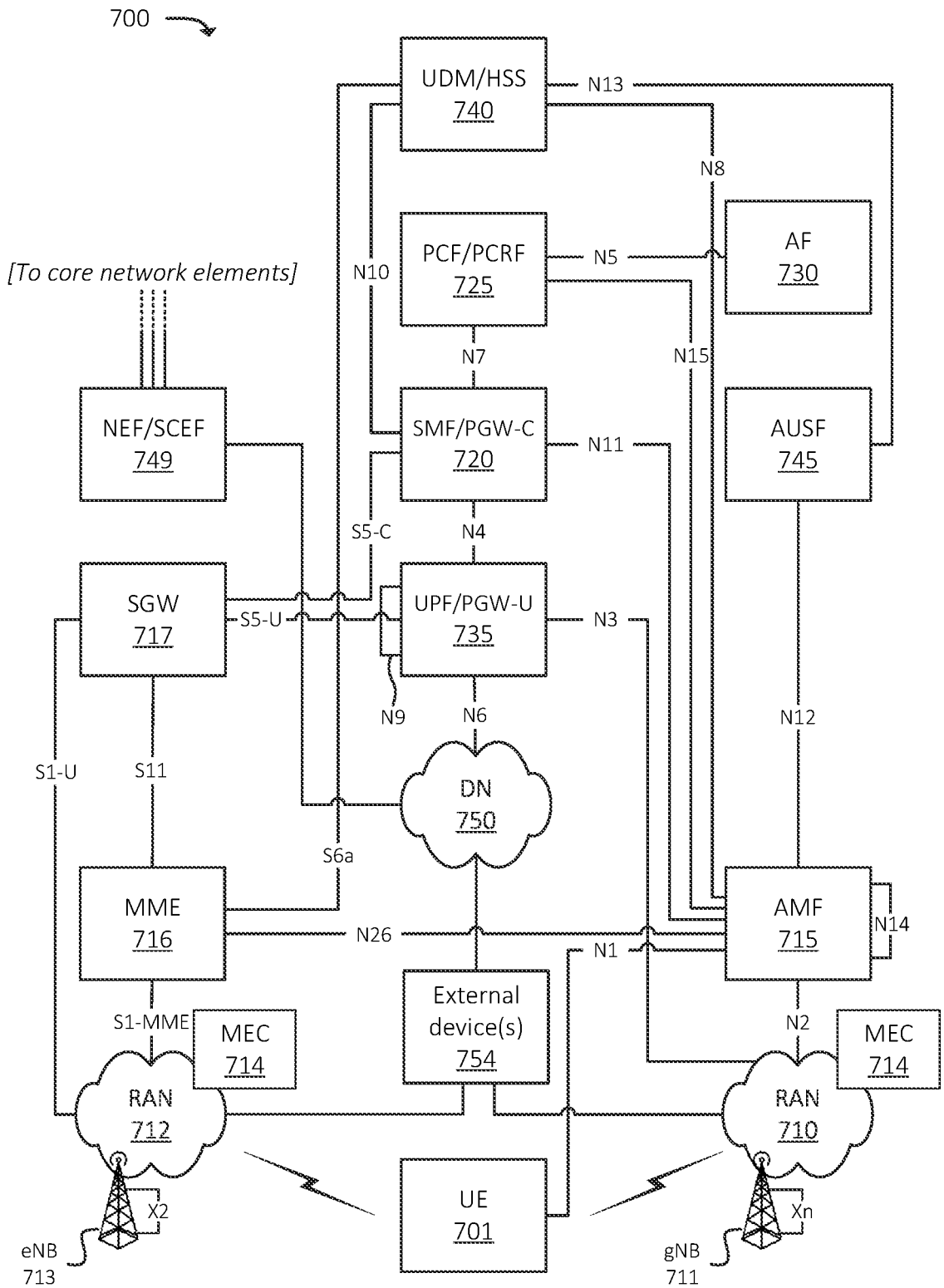
FIGS. 7 and 8 illustrate example environments in which one or more embodiments, described herein, may be implemented.

FIG. 7 illustrates an example environment 700, in which one or more embodiments may be implemented. In some embodiments, environment 700 may correspond to a Fifth Generation ("5G") network, and/or may include elements of a 5G network. In some embodiments, environment 700 may correspond to a 5G Non-Standalone ("NSA") architecture, in which a 5G radio access technology ("RAT") may be used in conjunction with one or more other RATs (e.g., a Long-Term Evolution ("LTE") RAT), and/or in which elements of a 5G core network may be implemented by, may be communicatively coupled with, and/or may include elements of another type of core network (e.g., an evolved packet core ("EPC")). In some embodiments, portions of environment 700 may represent or may include a 5G core ("5GC"). As shown, environment 700 may include UE 701, RAN 710 (which may include one or more Next Generation Node Bs ("gNBs") 711), RAN 712 (which may include one or more evolved Node Bs ("eNBs") 713), and various network functions such as Access and Mobility Management Function ("AMF") 715, Mobility Management Entity ("MME") 716, Serving Gateway ("SGW") 717, Session Management Function ("SMF")/Packet Data Network ("PDN") Gateway ("PGW")-Control plane function ("PGW-C") 720, Policy Control Function ("PCF")/Policy Charging and Rules Function ("PCRF") 725, Application Function ("AF") 730, User Plane Function ("UPF")/PGW-User plane function ("PGW-U") 735, Unified Data Management ("UDM")/Home Subscriber Server ("HSS") 740, Authentication Server Function ("AUSF") 745, and Network Exposure Function ("NEF")/Service Capability Exposure Function ("SCEF") 749. Environment 700 may also include one or more networks, such as Data Network ("DN") 750. Environment 700 may include one or more additional devices or systems communicatively coupled to one or more networks (e.g., DN 750), such as one or more external devices 754.

The example shown in FIG. 7 illustrates one instance of each network component or function (e.g., one instance of SMF/PGW-C 720, PCF/PCRF 725, UPF/PGW-U 735, UDM/HSS 740, and/or AUSF 745). In practice, environment 700 may include multiple instances of such components or functions. For example, in some embodiments, environment 700 may include multiple "slices" of a core network, where each slice includes a discrete and/or logical set of network functions (e.g., one slice may include a first instance of AMF 715, SMF/PGW-C 720, PCF/PCRF 725, and/or UPF/PGW-U 735, while another slice may include a second instance of AMF 715, SMF/PGW-C 720, PCF/PCRF 725, and/or UPF/PGW-U 735). The different slices may provide differentiated levels of service, such as service in accordance with different Quality of Service ("QoS") parameters.

The quantity of devices and/or networks, illustrated in FIG. 7, is provided for explanatory purposes only. In practice, environment 700 may include additional devices and/or networks, fewer devices and/or networks, different devices and/or networks, or differently arranged devices and/or networks than illustrated in FIG. 7. For example, while not shown, environment 700 may include devices that facilitate or enable communication between various components shown in environment 700, such as routers, modems, gateways, switches, hubs, etc. In some implementations, one or more devices of environment 700 may be physically integrated in, and/or may be physically attached to, one or more other devices of environment 700. Alternatively, or additionally, one or more of the devices of environment 700 may perform one or more network functions described as being performed by another one or more of the devices of environment 700.

Additionally, one or more elements of environment 700 may be implemented in a virtualized and/or containerized manner. For example, one or more of the elements of environment 700 may be implemented by one or more Virtualized Network Functions ("VNFs"), Cloud-Native Network Functions ("CNFs"), etc. In such embodiments, environment 700 may include, may implement, and/or may be communicatively coupled to an orchestration platform that provisions hardware resources, installs containers or applications, performs load balancing, and/or otherwise manages the deployment of such elements of environment 700. In some embodiments, such orchestration and/or management of such elements of environment 700 may be performed by, or in conjunction with, the open-source Kubernetes® application programming interface ("API") or some other suitable virtualization, containerization, and/or orchestration system.

Elements of environment 700 may interconnect with each other and/or other devices via wired connections, wireless connections, or a combination of wired and wireless connections. Examples of interfaces or communication pathways between the elements of environment 700, as shown in FIG. 7, may include an N1 interface, an N2 interface, an N3 interface, an N4 interface, an N5 interface, an N6 interface, an N7 interface, an N8 interface, an N9 interface, an N10 interface, an N11 interface, an N12 interface, an N13 interface, an N14 interface, an N15 interface, an N26 interface, an S1-C interface, an S1-U interface, an S5-C interface, an S5-U interface, an S6a interface, an S11 interface, and/or one or more other interfaces. Such interfaces may include interfaces not explicitly shown in FIG. 7, such as Service-Based Interfaces ("SBIs"), including an Namf interface, an Nudm interface, an Npcf interface, an Nupf interface, an Nnef interface, an Nsmf interface, and/or one or more other SBIs.

UE 701 may include a computation and communication device, such as a wireless mobile communication device that is capable of communicating with RAN 710, RAN 712, and/or DN 750. UE 701 may be, or may include, a radiotelephone, a personal communications system ("PCS") terminal (e.g., a device that combines a cellular radiotelephone with data processing and data communications capabilities), a personal digital assistant ("PDA") (e.g., a device that may include a radiotelephone, a pager, Internet/intranet access, etc.), a smart phone, a laptop computer, a tablet computer, a camera, a personal gaming system, an Internet of Things ("IoT") device (e.g., a sensor, a smart home appliance, a wearable device, a Machine-to-Machine ("M2M") device, or the like), a Fixed Wireless Access ("FWA") device, or another type of mobile computation and communication device. UE 701 may send traffic to and/or receive traffic (e.g., user plane traffic) from DN 750 via RAN 710, RAN 712, and/or UPF/PGW-U 735. As discussed above, UE 701 may include, may be communicatively coupled to, may implement, may be implemented by, and/or may otherwise be associated with one or more WDDs 103, in accordance with some embodiments.

RAN 710 may be, or may include, a 5G RAN that includes one or more base stations (e.g., one or more gNBs 711), via which UE 701 may communicate with one or more other elements of environment 700. UE 701 may communicate with RAN 710 via an air interface (e.g., as provided by gNB 711). For instance, RAN 710 may receive traffic (e.g., user plane traffic such as voice call traffic, data traffic, messaging traffic, etc.) from UE 701 via the air interface, and may communicate the traffic to UPF/PGW-U 735 and/or one or more other devices or networks. Further, RAN 710 may receive signaling traffic, control plane traffic, etc. from UE 701 via the air interface, and may communicate such signaling traffic, control plane traffic, etc. to AMF 715 and/or one or more other devices or networks. Additionally, RAN 710 may receive traffic intended for UE 701 (e.g., from UPF/PGW-U 735, AMF 715, and/or one or more other devices or networks) and may communicate the traffic to UE 701 via the air interface. In some embodiments, base station 107 may be, may include, and/or may be implemented by one or more gNBs 711.

RAN 712 may be, or may include, a LTE RAN that includes one or more base stations (e.g., one or more eNBs 713), via which UE 701 may communicate with one or more other elements of environment 700. UE 701 may communicate with RAN 712 via an air interface (e.g., as provided by eNB 713). For instance, RAN 712 may receive traffic (e.g., user plane traffic such as voice call traffic, data traffic, messaging traffic, signaling traffic, etc.) from UE 701 via the air interface, and may communicate the traffic to UPF/PGW-U 735 (e.g., via SGW 717) and/or one or more other devices or networks. Further, RAN 712 may receive signaling traffic, control plane traffic, etc. from UE 701 via the air interface, and may communicate such signaling traffic, control plane traffic, etc. to MME 716 and/or one or more other devices or networks. Additionally, RAN 712 may receive traffic intended for UE 701 (e.g., from UPF/PGW-U 735, MME 716, SGW 717, and/or one or more other devices or networks) and may communicate the traffic to UE 701 via the air interface.

One or more RANs of environment 700 (e.g., RAN 710 and/or RAN 712) may include, may implement, and/or may otherwise be communicatively coupled to one or more edge computing devices, such as one or more MECs 714. As noted above, MECs 714 may be, may be implemented by, may implement, and/or may otherwise be associated with respective edge computing devices 109. MECs 714 may be co-located with wireless network infrastructure equipment of RANs 710 and/or 712 (e.g., one or more gNBs 711 and/or one or more eNBs 713, respectively). Additionally, or alternatively, MECs 714 may otherwise be associated with geographical regions (e.g., coverage areas) of wireless network infrastructure equipment of RANs 710 and/or 712. In some embodiments, one or more MECs 714 may be implemented by the same set of hardware resources, the same set of devices, etc. that implement wireless network infrastructure equipment of RANs 710 and/or 712. In some embodiments, one or more MECs 714 may be implemented by different hardware resources, a different set of devices, etc. from hardware resources or devices that implement wireless network infrastructure equipment of RANs 710 and/or 712. In some embodiments, MECs 714 may be communicatively coupled to wireless network infrastructure equipment of RANs 710 and/or 712 (e.g., via a high-speed and/or low-latency link such as a physical wired interface, a high-speed and/or low-latency wireless interface, or some other suitable communication pathway).

MECs 714 may include hardware resources (e.g., configurable or provisionable hardware resources) that may be configured to provide services and/or otherwise process traffic to and/or from UE 701, via RAN 710 and/or 712. For example, RAN 710 and/or 712 may route some traffic from UE 701 (e.g., traffic associated with one or more particular services, applications, application types, etc.) to a respective MEC 714 instead of to core network elements of 700 (e.g., UPF/PGW-U 735). MEC 714 may accordingly provide services to UE 701 by processing such traffic, performing one or more computations based on the received traffic, and providing traffic to UE 701 via RAN 710 and/or 712. MEC 714 may include, and/or may implement, some or all of the functionality described above with respect to UPF/PGW-U 735, AF 730, one or more application servers, and/or one or more other devices, systems, VNFs, CNFs, etc. In this manner, ultra-low latency services may be provided to UE 701, as traffic does not need to traverse links (e.g., backhaul links) between RAN 710 and/or 712 and the core network.

AMF 715 may include one or more devices, systems, VNFs, CNFs, etc., that perform operations to register UE 701 with the 5G network, to establish bearer channels associated with a session with UE 701, to hand off UE 701 from the 5G network to another network, to hand off UE 701 from the other network to the 5G network, manage mobility of UE 701 between RANs 710 and/or gNBs 711, and/or to perform other operations. In some embodiments, the 5G network may include multiple AMFs 715, which communicate with each other via the N14 interface (denoted in FIG. 7 by the line marked "N14" originating and terminating at AMF 715).

MME 716 may include one or more devices, systems, VNFs, CNFs, etc., that perform operations to register UE 701 with the EPC, to establish bearer channels associated with a session with UE 701, to hand off UE 701 from the EPC to another network, to hand off UE 701 from another network to the EPC, manage mobility of UE 701 between RANs 712 and/or eNBs 713, and/or to perform other operations.

SGW 717 may include one or more devices, systems, VNFs, CNFs, etc., that aggregate traffic received from one or more eNBs 713 and send the aggregated traffic to an external network or device via UPF/PGW-U 735. Additionally, SGW 717 may aggregate traffic received from one or more UPF/PGW-Us 735 and may send the aggregated traffic to one or more eNBs 713. SGW 717 may operate as an anchor for the user plane during inter-eNB handovers and as an anchor for mobility between different telecommunication networks or RANs (e.g., RANs 710 and 712).

SMF/PGW-C 720 may include one or more devices, systems, VNFs, CNFs, etc., that gather, process, store, and/or provide information in a manner described herein. SMF/PGW-C 720 may, for example, facilitate the establishment of communication sessions on behalf of UE 701. In some embodiments, the establishment of communications sessions may be performed in accordance with one or more policies provided by PCF/PCRF 725.

PCF/PCRF 725 may include one or more devices, systems, VNFs, CNFs, etc., that aggregate information to and from the 5G network and/or other sources. PCF/PCRF 725 may receive information regarding policies and/or subscriptions from one or more sources, such as subscriber databases and/or from one or more users (such as, for example, an administrator associated with PCF/PCRF 725).

AF 730 may include one or more devices, systems, VNFs, CNFs, etc., that receive, store, and/or provide information that may be used in determining parameters (e.g., quality of service parameters, charging parameters, or the like) for certain applications.

UPF/PGW-U 735 may include one or more devices, systems, VNFs, CNFs, etc., that receive, store, and/or provide data (e.g., user plane data). For example, UPF/PGW-U 735 may receive user plane data (e.g., voice call traffic, data traffic, etc.), destined for UE 701, from DN 750, and may forward the user plane data toward UE 701 (e.g., via RAN 710, SMF/PGW-C 720, and/or one or more other devices). In some embodiments, multiple instances of UPF/PGW-U 735 may be deployed (e.g., in different geographical locations), and the delivery of content to UE 701 may be coordinated via the N9 interface (e.g., as denoted in FIG. 7 by the line marked "N9" originating and terminating at UPF/PGW-U 735). Similarly, UPF/PGW-U 735 may receive traffic from UE 701 (e.g., via RAN 710, RAN 712, SMF/PGW-C 720, and/or one or more other devices), and may forward the traffic toward DN 750. In some embodiments, UPF/PGW-U 735 may communicate (e.g., via the N4 interface) with SMF/PGW-C 720, regarding user plane data processed by UPF/PGW-U 735.

UDM/HSS 740 and AUSF 745 may include one or more devices, systems, VNFs, CNFs, etc., that manage, update, and/or store, in one or more memory devices associated with AUSF 745 and/or UDM/HSS 740, profile information associated with a subscriber. In some embodiments, UDM/HSS 740 may include, may implement, may be communicatively coupled to, and/or may otherwise be associated with some other type of repository or database, such as a Unified Data Repository ("UDR"). AUSF 745 and/or UDM/HSS 740 may perform authentication, authorization, and/or accounting operations associated with one or more UEs 701 and/or one or more communication sessions associated with one or more UEs 701.

DN 750 may include one or more wired and/or wireless networks. For example, DN 750 may include an Internet Protocol ("IP")-based PDN, a wide area network ("WAN") such as the Internet, a private enterprise network, and/or one or more other networks. UE 701 may communicate, through DN 750, with data servers, other UEs 701, and/or to other servers or applications that are coupled to DN 750. DN 750 may be connected to one or more other networks, such as a public switched telephone network ("PSTN"), a public land mobile network ("PLMN"), and/or another network. DN 750 may be connected to one or more devices, such as content providers, applications, web servers, and/or other devices, with which UE 701 may communicate.

External devices 754 may include one or more devices or systems that communicate with UE 701 via 750 and one or more elements of 700 (e.g., via UPF/PGW-U 735). In some embodiments, external device 754 may include, may implement, and/or may otherwise be associated with DSC 101. External devices 754 may include, for example, one or more application servers, content provider systems, web servers, or the like. External devices 754 may, for example, implement "server-side" applications that communicate with "client-side" applications executed by UE 701. External devices 754 may provide services to UE 701 such as gaming services, videoconferencing services, messaging services, email services, web services, and/or other types of services.

In some embodiments, external devices 754 may communicate with one or more elements of environment 700 (e.g., core network elements) via NEF/SCEF 749. NEF/SCEF 749 include one or more devices, systems, VNFs, CNFs, etc. that provide access to information, APIs, and/or other operations or mechanisms of one or more core network elements to devices or systems that are external to the core network (e.g., to external device 754 via DN 750). NEF/SCEF 749 may maintain authorization and/or authentication information associated with such external devices or systems, such that NEF/SCEF 749 is able to provide information, that is authorized to be provided, to the external devices or systems. For example, a given external device 754 may request particular information associated with one or more core network elements. NEF/SCEF 749 may authenticate the request and/or otherwise verify that external device 754 is authorized to receive the information, and may request, obtain, or otherwise receive the information from the one or more core network elements. In some embodiments, NEF/SCEF 749 may include, may implement, may be implemented by, may be communicatively coupled to, and/or may otherwise be associated with a Security Edge Protection Proxy ("SEPP"), which may perform some or all of the functions discussed above. External device 754 may, in some situations, subscribe to particular types of requested information provided by the one or more core network elements, and the one or more core network elements may provide (e.g., "push") the requested information to NEF/SCEF 749 (e.g., in a periodic or otherwise ongoing basis).

In some embodiments, external devices 754 may communicate with one or more elements of RAN 710 and/or 712 via an API or other suitable interface. For example, a given external device 754 may provide instructions, requests, etc. to RAN 710 and/or 712 to provide one or more services via one or more respective MECs 714. In some embodiments, such instructions, requests, etc. may include QoS parameters, Service Level Agreements ("SLAs"), etc. (e.g., maximum latency thresholds, minimum throughput thresholds, etc.) associated with the services.

Figure 8:
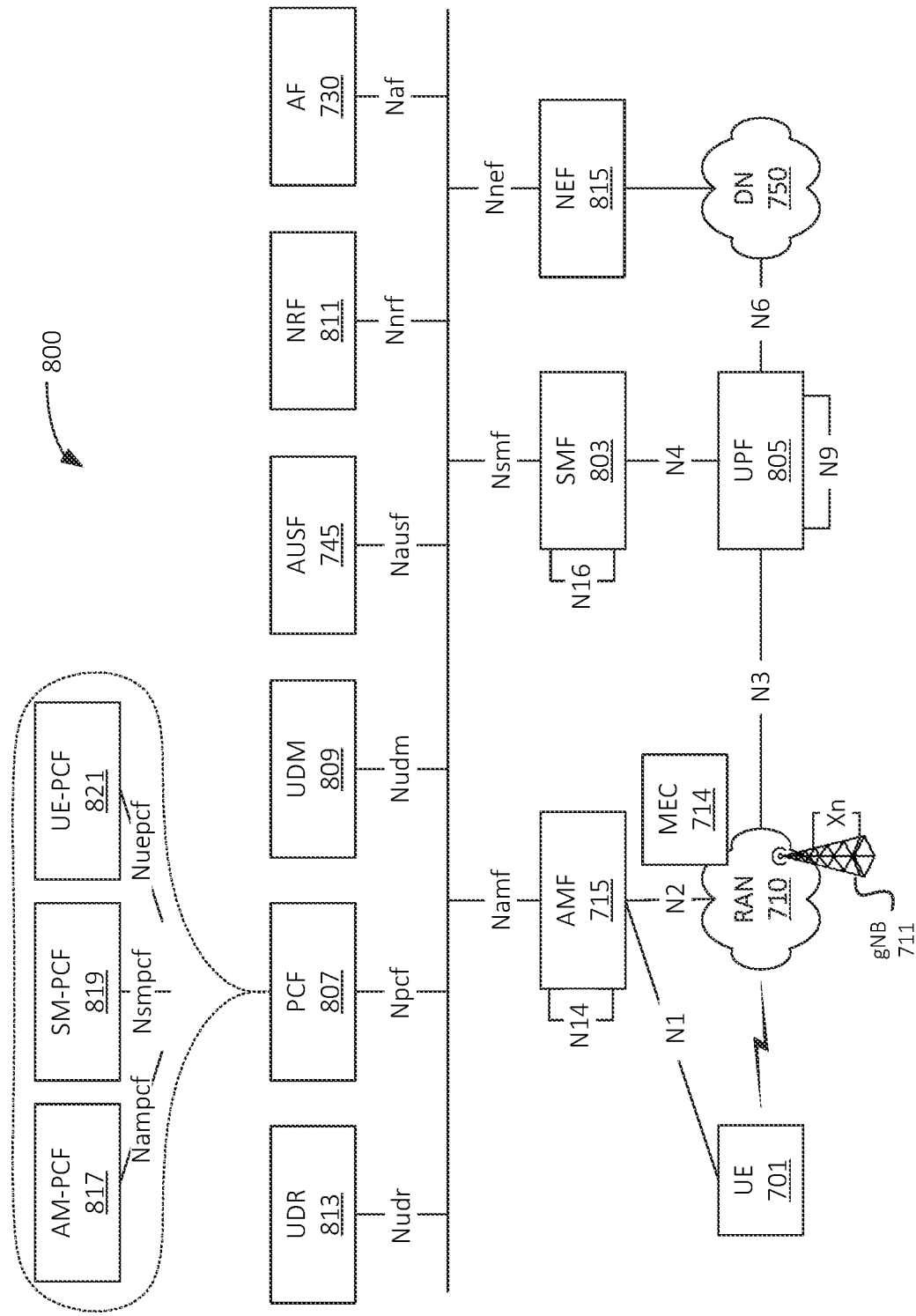

FIG. 8 illustrates another example environment 800, in which one or more embodiments may be implemented. In some embodiments, environment 800 may correspond to a 5G network, and/or may include elements of a 5G network. In some embodiments, environment 800 may correspond to a 5G SA architecture. In some embodiments, environment 800 may include a 5GC, in which 5GC network elements perform one or more operations described herein.

As shown, environment 800 may include UE 701, RAN 710 (which may include one or more gNBs 711 or other types of wireless network infrastructure) and various network functions, which may be implemented as VNFs, CNFs, etc. Such network functions may include AMF 715, SMF 803, UPF 805, PCF 807, UDM 809, AUSF 745, Network Repository Function ("NRF") 811, AF 730, UDR 813, and NEF 815. Environment 800 may also include or may be communicatively coupled to one or more networks, such as Data Network DN 750.

The example shown in FIG. 8 illustrates one instance of each network component or function (e.g., one instance of SMF 803, UPF 805, PCF 807, UDM 809, AUSF 745, etc.). In practice, environment 800 may include multiple instances of such components or functions. For example, in some embodiments, environment 800 may include multiple "slices" of a core network, where each slice includes a discrete and/or logical set of network functions (e.g., one slice may include a first instance of SMF 803, PCF 807, UPF 805, etc., while another slice may include a second instance of SMF 803, PCF 807, UPF 805, etc.). Additionally, or alternatively, one or more of the network functions of environment 800 may implement multiple network slices. The different slices may provide differentiated levels of service, such as service in accordance with different QoS parameters.

The quantity of devices and/or networks, illustrated in FIG. 8, is provided for explanatory purposes only. In practice, environment 800 may include additional devices and/or networks, fewer devices and/or networks, different devices and/or networks, or differently arranged devices and/or networks than illustrated in FIG. 8. For example, while not shown, environment 800 may include devices that facilitate or enable communication between various components shown in environment 800, such as routers, modems, gateways, switches, hubs, etc. In some implementations, one or more devices of environment 800 may be physically integrated in, and/or may be physically attached to, one or more other devices of environment 800. Alternatively, or additionally, one or more of the devices of environment 800 may perform one or more network functions described as being performed by another one or more of the devices of environment 800.

Elements of environment 800 may interconnect with each other and/or other devices via wired connections, wireless connections, or a combination of wired and wireless connections. Examples of interfaces or communication pathways between the elements of environment 800, as shown in FIG. 8, may include interfaces shown in FIG. 8 and/or one or more interfaces not explicitly shown in FIG. 8. These interfaces may include interfaces between specific network functions, such as an N1 interface, an N2 interface, an N3 interface, an N6 interface, an N9 interface, an N14 interface, an N16 interface, and/or one or more other interfaces. In some embodiments, one or more elements of environment 800 may communicate via a service-based architecture ("SBA"), in which a routing mesh or other suitable routing mechanism may route communications to particular network functions based on interfaces or identifiers associated with such network functions. Such interfaces may include or may be referred to as SBIs, including an Namf interface (e.g., indicating communications to be routed to AMF 715), an Nudm interface (e.g., indicating communications to be routed to UDM 809), an Npcf interface, an Nupf interface, an Nnef interface, an Nsmf interface, an Nnrf interface, an Nudr interface, an Naf interface, and/or one or more other SBIs.

UPF 805 may include one or more devices, systems, VNFs, CNFs, etc., that receive, route, process, and/or forward traffic (e.g., user plane traffic). As discussed above, UPF 805 may communicate with UE 701 via one or more communication sessions, such as PDU sessions. Such PDU sessions may be associated with a particular network slice or other suitable QoS parameters, as noted above. UPF 805 may receive downlink user plane traffic (e.g., voice call traffic, data traffic, etc. destined for UE 701) from DN 750, and may forward the downlink user plane traffic toward UE 701 (e.g., via RAN 710). In some embodiments, multiple UPFs 805 may be deployed (e.g., in different geographical locations), and the delivery of content to UE 701 may be coordinated via the N9 interface. Similarly, UPF 805 may receive uplink traffic from UE 701 (e.g., via RAN 710), and may forward the traffic toward DN 750. In some embodiments, UPF 805 may implement, may be implemented by, may be communicatively coupled to, and/or may otherwise be associated with UPF/PGW-U 735. In some embodiments, UPF 805 may communicate (e.g., via the N4 interface) with SMF 803, regarding user plane data processed by UPF 805 (e.g., to provide analytics or reporting information, to receive policy and/or authorization information, etc.).

PCF 807 may include one or more devices, systems, VNFs, CNFs, etc., that aggregate, derive, generate, etc. policy information associated with the 5GC and/or UEs 701 that communicate via the 5GC and/or RAN 710. PCF 807 may receive information regarding policies and/or subscriptions from one or more sources, such as subscriber databases (e.g., UDM 809, UDR 813, etc.), and/or from one or more users such as, for example, an administrator associated with PCF 807. In some embodiments, the functionality of PCF 807 may be split into multiple network functions or subsystems, such as access and mobility PCF ("AM-PCF") 817, session management PCF ("SM-PCF") 819, UE PCF ("UE-PCF") 821, and so on. Such different "split" PCFs may be associated with respective SBIs (e.g., AM-PCF 817 may be associated with an Nampcf SBI, SM-PCF 819 may be associated with an Nsmpcf SBI, UE-PCF 821 may be associated with an Nuepcf SBI, and so on) via which other network functions may communicate with the split PCFs. The split PCFs may maintain information regarding policies associated with different devices, systems, and/or network functions.

NRF 811 may include one or more devices, systems, VNFs, CNFs, etc. that maintain routing and/or network topology information associated with the 5GC. For example, NRF 811 may maintain and/or provide IP addresses of one or more network functions, routes associated with one or more network functions, discovery and/or mapping information associated with particular network functions or network function instances (e.g., whereby such discovery and/or mapping information may facilitate the SBA), and/or other suitable information.

UDR 813 may include one or more devices, systems, VNFs, CNFs, etc. that provide user and/or subscriber information, based on which PCF 807 and/or other elements of environment 800 may determine access policies, QoS policies, charging policies, or the like. In some embodiments, UDR 813 may receive such information from UDM 809 and/or one or more other sources.

NEF 815 include one or more devices, systems, VNFs, CNFs, etc. that provide access to information, APIs, and/or other operations or mechanisms of the 5GC to devices or systems that are external to the 5GC. NEF 815 may maintain authorization and/or authentication information associated with such external devices or systems, such that NEF 815 is able to provide information, that is authorized to be provided, to the external devices or systems. Such information may be received from other network functions of the 5GC (e.g., as authorized by an administrator or other suitable entity associated with the 5GC), such as SMF 803, UPF 805, a charging function ("CHF") of the 5GC, and/or other suitable network function. NEF 815 may communicate with external devices or systems (e.g., external devices 754) via DN 750 and/or other suitable communication pathways.

While environment 800 is described in the context of a 5GC, as noted above, environment 800 may, in some embodiments, include or implement one or more other types of core networks. For example, in some embodiments, environment 800 may be or may include a converged packet core, in which one or more elements may perform some or all of the functionality of one or more 5GC network functions and/or one or more EPC network functions. For example, in some embodiments, AMF 715 may include, may implement, may be implemented by, and/or may otherwise be associated with MME 716; SMF 803 may include, may implement, may be implemented by, and/or may otherwise be associated with SGW 717; PCF 807 may include, may implement, may be implemented by, and/or may otherwise be associated with a PCRF (e.g., PCF/PCRF 725); NEF 815 may include, may implement, may be implemented by, and/or may otherwise be associated with a SCEF (e.g., NEF/SCEF 749); and so on.

Figure 9:
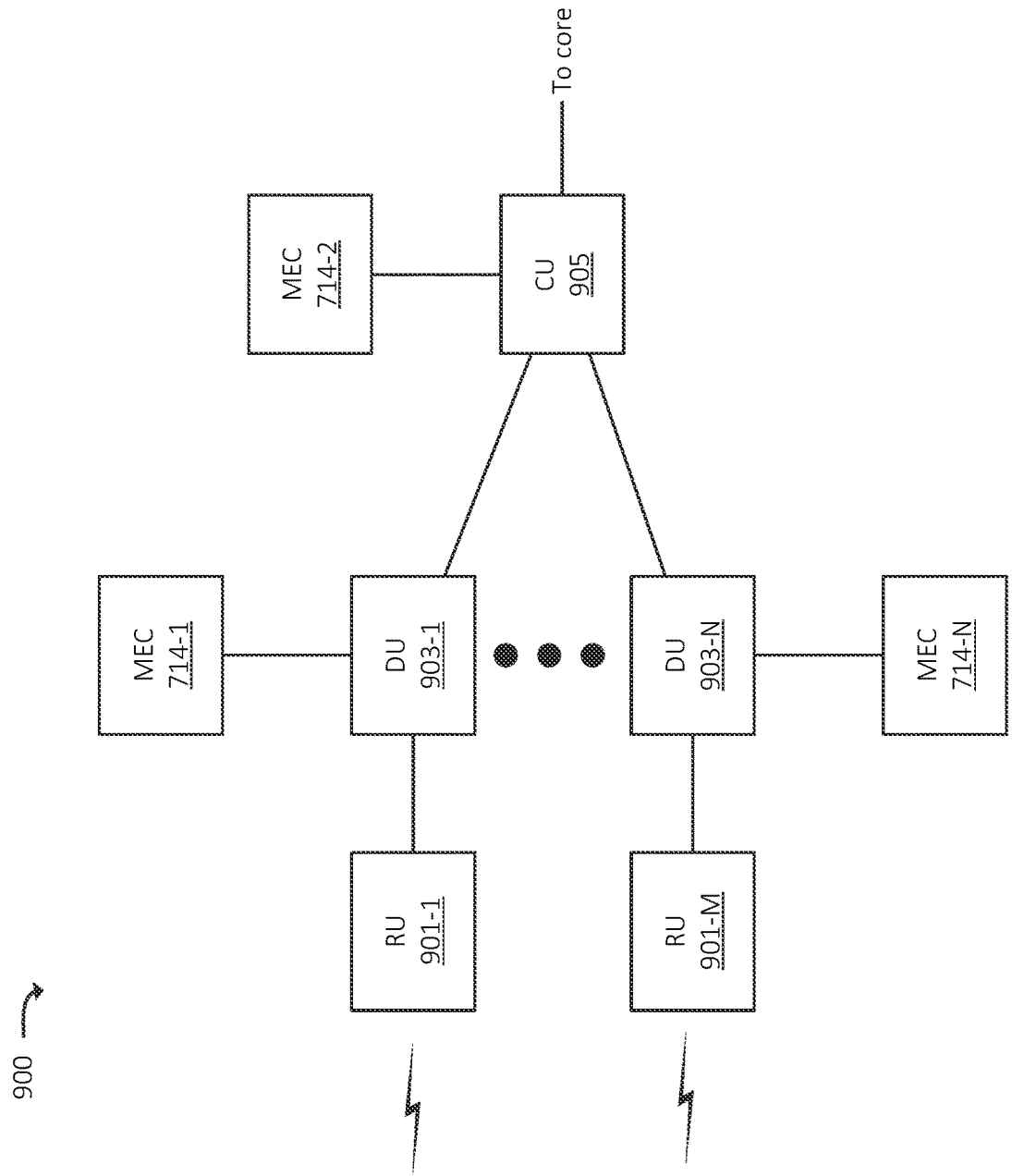
FIG. 9 illustrates an example arrangement of a radio access network ("RAN"), in accordance with some embodiments.

FIG. 9 illustrates an example RAN environment 900, which may be included in and/or implemented by one or more RANs (e.g., RAN 710 or some other RAN). In some embodiments, a particular RAN 710 may include one RAN environment 900. In some embodiments, a particular RAN 710 may include multiple RAN environments 900. In some embodiments, RAN environment 900 may correspond to a particular gNB 711 of RAN 710. In some embodiments, RAN environment 900 may correspond to multiple gNBs 711. In some embodiments, RAN environment 900 may correspond to one or more other types of base stations of one or more other types of RANs. As shown, RAN environment 900 may include Central Unit ("CU") 905, one or more Distributed Units ("DUs") 903-1 through 903-N (referred to individually as "DU 903," or collectively as "DUs 903"), and one or more Radio Units ("RUs") 901-1 through 901-M (referred to individually as "RU 901," or collectively as "RUs 901").

CU 905 may communicate with a core of a wireless network (e.g., may communicate with one or more of the devices or systems described above with respect to FIG. 8, such as AMF 715 and/or UPF 805). In the uplink direction (e.g., for traffic from UEs 701 to a core network), CU 905 may aggregate traffic from DUs 903, and forward the aggregated traffic to the core network. In some embodiments, CU 905 may receive traffic according to a given protocol (e.g., Radio Link Control ("RLC")) from DUs 903, and may perform higher-layer processing (e.g., may aggregate/process RLC packets and generate Packet Data Convergence Protocol ("PDCP") packets based on the RLC packets) on the traffic received from DUs 903.

In accordance with some embodiments, CU 905 may receive downlink traffic (e.g., traffic from the core network) for a particular UE 701, and may determine which DU(s) 903 should receive the downlink traffic. DU 903 may include one or more devices that transmit traffic between a core network (e.g., via CU 905) and UE 701 (e.g., via a respective RU 901). DU 903 may, for example, receive traffic from RU 901 at a first layer (e.g., physical ("PHY") layer traffic, or lower PHY layer traffic), and may process/aggregate the traffic to a second layer (e.g., upper PHY and/or RLC). DU 903 may receive traffic from CU 905 at the second layer, may process the traffic to the first layer, and provide the processed traffic to a respective RU 901 for transmission to UE 701.

RU 901 may include hardware circuitry (e.g., one or more RF transceivers, antennas, radios, and/or other suitable hardware) to communicate wirelessly (e.g., via an RF interface) with one or more UEs 701, one or more other DUs 903 (e.g., via RUs 901 associated with DUs 903), and/or any other suitable type of device. In the uplink direction, RU 901 may receive traffic from UE 701 and/or another DU 903 via the RF interface and may provide the traffic to DU 903. In the downlink direction, RU 901 may receive traffic from DU 903, and may provide the traffic to UE 701 and/or another DU 903.

One or more elements of RAN environment 900 may, in some embodiments, be communicatively coupled to one or more MECs 714. For example, DU 903-1 may be communicatively coupled to MEC 714-1, DU 903-N may be communicatively coupled to MEC 714-N, CU 905 may be communicatively coupled to MEC 714-2, and so on. MECs 714 may include hardware resources (e.g., configurable or provisionable hardware resources) that may be configured to provide services and/or otherwise process traffic to and/or from UE 701, via a respective RU 901.

For example, DU 903-1 may route some traffic, from UE 701, to MEC 714-1 instead of to a core network via CU 905. MEC 714-1 may process the traffic, perform one or more computations based on the received traffic, and may provide traffic to UE 701 via RU 901-1. As discussed above, MEC 714 may include, and/or may implement, some or all of the functionality described above with respect to UPF 805, AF 730, and/or one or more other devices, systems, VNFs, CNFs, etc. In this manner, ultra-low latency services may be provided to UE 701, as traffic does not need to traverse DU 903, CU 905, links between DU 903 and CU 905, and an intervening backhaul network between RAN environment 900 and the core network.

Figure 10:
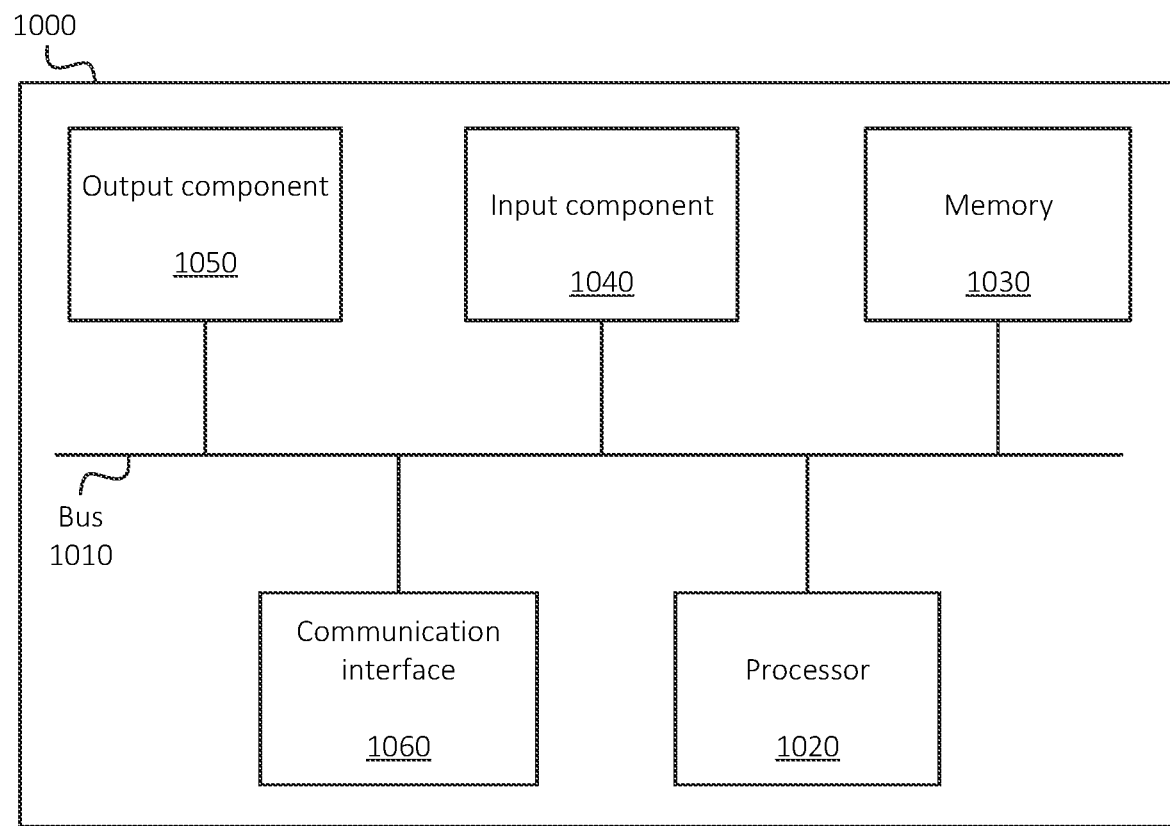
FIG. 10 illustrates example components of one or more devices, in accordance with one or more embodiments described herein.

FIG. 10 illustrates example components of device 1000. One or more of the devices described above may include one or more devices 1000. Device 1000 may include bus 1010, processor 1020, memory 1030, input component 1040, output component 1050, and communication interface 1060. In another implementation, device 1000 may include additional, fewer, different, or differently arranged components.

Bus 1010 may include one or more communication paths that permit communication among the components of device 1000. Processor 1020 may include a processor, microprocessor, a set of provisioned hardware resources of a cloud computing system, or other suitable type of hardware that interprets and/or executes instructions (e.g., processor-executable instructions). In some embodiments, processor 1020 may be or may include one or more hardware processors. Memory 1030 may include any type of dynamic storage device that may store information and instructions for execution by processor 1020, and/or any type of non-volatile storage device that may store information for use by processor 1020.

Input component 1040 may include a mechanism that permits an operator to input information to device 1000 and/or other receives or detects input from a source external to input component 1040, such as a touchpad, a touchscreen, a keyboard, a keypad, a button, a switch, a microphone or other audio input component, etc. In some embodiments, input component 1040 may include, or may be communicatively coupled to, one or more sensors, such as a motion sensor (e.g., which may be or may include a gyroscope, accelerometer, or the like), a location sensor (e.g., a Global Positioning System ("GPS")-based location sensor or some other suitable type of location sensor or location determination component), a thermometer, a barometer, and/or some other type of sensor. Output component 1050 may include a mechanism that outputs information to the operator, such as a display, a speaker, one or more light emitting diodes ("LEDs"), etc.

Communication interface 1060 may include any transceiver-like mechanism that enables device 1000 to communicate with other devices and/or systems (e.g., via RAN 710, RAN 712, DN 750, etc.). For example, communication interface 1060 may include an Ethernet interface, an optical interface, a coaxial interface, or the like. Communication interface 1060 may include a wireless communication device, such as an infrared ("IR") receiver, a Bluetooth® radio, or the like. The wireless communication device may be coupled to an external device, such as a cellular radio, a remote control, a wireless keyboard, a mobile telephone, etc. In some embodiments, device 1000 may include more than one communication interface 1060. For instance, device 1000 may include an optical interface, a wireless interface, an Ethernet interface, and/or one or more other interfaces.

Device 1000 may perform certain operations relating to one or more processes described above. Device 1000 may perform these operations in response to processor 1020 executing instructions, such as software instructions, processor-executable instructions, etc. stored in a computer-readable medium, such as memory 1030. A computer-readable medium may be defined as a non-transitory memory device. A memory device may include space within a single physical memory device or spread across multiple physical memory devices. The instructions may be read into memory 1030 from another computer-readable medium or from another device. The instructions stored in memory 1030 may be processor-executable instructions that cause processor 1020 to perform processes described herein. Alternatively, hardwired circuitry may be used in place of or in combination with software instructions to implement processes described herein. Thus, implementations described herein are not limited to any specific combination of hardware circuitry and software.

The foregoing description of implementations provides illustration and description, but is not intended to be exhaustive or to limit the possible implementations to the precise form disclosed. Modifications and variations are possible in light of the above disclosure or may be acquired from practice of the implementations.

For example, while series of blocks and/or signals have been described above (e.g., with regard to FIGS. 1-6), the order of the blocks and/or signals may be modified in other implementations. Further, non-dependent blocks and/or signals may be performed in parallel. Additionally, while the figures have been described in the context of particular devices performing particular acts, in practice, one or more other devices may perform some or all of these acts in lieu of, or in addition to, the above-mentioned devices.

The actual software code or specialized control hardware used to implement an embodiment is not limiting of the embodiment. Thus, the operation and behavior of the embodiment has been described without reference to the specific software code, it being understood that software and control hardware may be designed based on the description herein.

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

Further, while certain connections or devices are shown, in practice, additional, fewer, or different, connections or devices may be used. Furthermore, while various devices and networks are shown separately, in practice, the functionality of multiple devices may be performed by a single device, or the functionality of one device may be performed by multiple devices. Further, multiple ones of the illustrated networks may be included in a single network, or a particular network may include multiple networks. Further, while some devices are shown as communicating with a network, some such devices may be incorporated, in whole or in part, as a part of the network.

To the extent the aforementioned implementations collect, store, or employ personal information of individuals, groups or other entities, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various access control, encryption and anonymization techniques for particularly sensitive information.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or more items, and may be used interchangeably with the phrase "one or more." Where only one item is intended, the terms "one," "single," "only," or similar language is used. Further, the phrase "based on" is intended to mean "based, at least in part, on" unless explicitly stated otherwise.

What is claimed is:

1. A device, comprising:
one or more processors configured to:
    maintain information indicating groups of wireless trip devices, wherein each group of wireless trip devices is associated with a set of alert conditions;
    maintain information associating each wireless trip device, of a plurality of wireless trip devices, with respective edge computing devices;
    receive a wireless alert from a particular wireless trip device, of the plurality of wireless trip devices, wherein the wireless alert indicates a particular electrical fault condition;
    identify, based on the respective sets of alert conditions associated with each group of wireless trip devices, a particular group of wireless trip devices with which the wireless alert is associated;
    identify a particular set of edge computing devices that are associated with respective wireless trip devices of the group of wireless trip devices; and
    output, to each edge computing device of the identified particular set of edge computing devices, a notification that is based on the wireless alert received from the particular wireless trip device, wherein each edge computing device wirelessly communicates with one or more respective wireless trip devices, of the group of wireless trip devices, based on the wireless alert received from the particular wireless trip device.

2. The device of claim 1, wherein the particular electrical fault condition is detected by the particular wireless trip device.

3. The device of claim 1, wherein the wireless alert is received via a base station that implements a Fifth Generation ("5G") radio access technology ("RAT").

4. The device of claim 1, wherein outputting the notification to each edge computing device includes outputting the notification via one or more dedicated links between the device and each edge computing device.

5. The device of claim 1, wherein the plurality of trip devices include one or more circuit breakers located at one or more electrical substations.

6. The device of claim 1, wherein the particular wireless trip device is located in a first electrical substation, and wherein at least one of the trip devices, of the particular group of wireless trip devices, is located at a second electrical substation.

7. The device of claim 1, wherein the particular wireless trip device is a first wireless trip device that is wirelessly connected to a particular base station, wherein the particular group of wireless trip devices includes a second wireless trip device that is wirelessly connected to the same particular base station, wherein the wireless alert is a first wireless alert, wherein the one or more processors are further configured to:
  output, via the particular base station, a second wireless alert to the second wireless trip device based on the first wireless alert.

8. A non-transitory computer-readable medium, storing a plurality of processor-executable instructions to:
  maintain information indicating groups of wireless trip devices, wherein each group of wireless trip devices is associated with a set of alert conditions;
  maintain information associating each wireless trip device, of a plurality of wireless trip devices, with respective edge computing devices;
  receive a wireless alert from a particular wireless trip device, of the plurality of wireless trip devices, wherein the wireless alert indicates a particular electrical fault condition;
  identify, based on the respective sets of alert conditions associated with each group of wireless trip devices, a particular group of wireless trip devices with which the wireless alert is associated;
  identify a particular set of edge computing devices that are associated with respective wireless trip devices of the group of wireless trip devices; and
  output, to each edge computing device of the identified particular set of edge computing devices, a notification that is based on the wireless alert received from the particular wireless trip device, wherein each edge computing device wirelessly communicates with one or more respective wireless trip devices, of the group of wireless trip devices, based on the wireless alert received from the particular wireless trip device.

9. The non-transitory computer-readable medium of claim 8, wherein the particular electrical fault condition is detected by the particular wireless trip device.

10. The non-transitory computer-readable medium of claim 8, wherein the wireless alert is received via a base station that implements a Fifth Generation ("5G") radio access technology ("RAT").

11. The non-transitory computer-readable medium of claim 8, wherein outputting the notification to each edge computing device includes outputting the notification via one or more dedicated links between the device and each edge computing device.

12. The non-transitory computer-readable medium of claim 8, wherein the plurality of trip devices include one or more circuit breakers located at one or more electrical substations.

13. The non-transitory computer-readable medium of claim 8, wherein the particular wireless trip device is located in a first electrical substation, and wherein at least one of the trip devices, of the particular group of wireless trip devices, is located at a second electrical substation.

14. The non-transitory computer-readable medium of claim 8, wherein the particular wireless trip device is a first wireless trip device that is wirelessly connected to a particular base station, wherein the particular group of wireless trip devices includes a second wireless trip device that is wirelessly connected to the same particular base station, wherein the wireless alert is a first wireless alert, wherein the plurality of processor-executable instructions further include processor-executable instructions to:
  output, via the particular base station, a second wireless alert to the second wireless trip device based on the first wireless alert.

15. A method, comprising:
  maintaining information indicating groups of wireless trip devices, wherein each group of wireless trip devices is associated with a set of alert conditions;
  maintaining information associating each wireless trip device, of a plurality of wireless trip devices, with respective edge computing devices;
  receiving a wireless alert from a particular wireless trip device, of the plurality of wireless trip devices, wherein the wireless alert indicates a particular electrical fault condition;
  identifying, based on the respective sets of alert conditions associated with each group of wireless trip devices, a particular group of wireless trip devices with which the wireless alert is associated;
  identifying a particular set of edge computing devices that are associated with respective wireless trip devices of the group of wireless trip devices; and
  outputting, to each edge computing device of the identified particular set of edge computing devices, a notification that is based on the wireless alert received from the particular wireless trip device, wherein each edge computing device wirelessly communicates with one or more respective wireless trip devices, of the group of wireless trip devices, based on the wireless alert received from the particular wireless trip device.

16. The method of claim 15, wherein the particular electrical fault condition is detected by the particular wireless trip device.

17. The method of claim 15, wherein outputting the notification to each edge computing device includes outputting the notification via one or more dedicated links between the device and each edge computing device.

18. The method of claim 15, wherein the plurality of trip devices include one or more circuit breakers located at one or more electrical substations.

19. The method of claim 15, wherein the particular wireless trip device is located in a first electrical substation, and wherein at least one of the trip devices, of the particular group of wireless trip devices, is located at a second electrical substation.

20. The method of claim 15, wherein the particular wireless trip device is a first wireless trip device that is wirelessly connected to a particular base station, wherein the particular group of wireless trip devices includes a second wireless trip device that is wirelessly connected to the same particular base station, wherein the wireless alert is a first wireless alert, the method further comprising:
  outputting, via the particular base station, a second wireless alert to the second wireless trip device based on the first wireless alert.

* * * * *